United States Patent
White et al.

(10) Patent No.: US 12,486,581 B2
(45) Date of Patent: Dec. 2, 2025

(54) CLEANING COMPOSITION WITH MOLYBDENUM ETCHING INHIBITOR

(71) Applicant: ENTEGRIS, INC., Billerica, MA (US)

(72) Inventors: Daniela White, Ridgefield, CT (US); Michael L. White, Ridgefield, CT (US); Youngmin Kim, Suwon-si (KR); Akshay Rajopadhye, Gainesville, FL (US); Atanu K. Das, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 18/207,569

(22) Filed: Jun. 8, 2023

(65) Prior Publication Data

US 2023/0399754 A1 Dec. 14, 2023

Related U.S. Application Data

(60) Provisional application No. 63/350,219, filed on Jun. 8, 2022.

(51) Int. Cl.
*C23G 1/18* (2006.01)
*B81C 1/00* (2006.01)
*H01L 21/02* (2006.01)

(52) U.S. Cl.
CPC ............ *C23G 1/18* (2013.01); *B81C 1/00857* (2013.01); *H01L 21/02057* (2013.01); *B81C 2201/0133* (2013.01); *B81C 2201/0142* (2013.01)

(58) Field of Classification Search
None
See application file for complete search history.

(56) References Cited

U.S. PATENT DOCUMENTS

| | | |
|---|---|---|
| 8,765,653 B2 | 7/2014 | Tamboli |
| 10,109,523 B2 | 10/2018 | Chung |
| 2007/0225186 A1* | 9/2007 | Fisher .................. C11D 7/3218 510/175 |
| 2015/0114429 A1 | 4/2015 | Jenq |
| 2016/0185595 A1* | 6/2016 | Chen ....................... G03F 7/405 252/79.3 |
| 2016/0322236 A1 | 11/2016 | Vermeulen |
| 2017/0200601 A1* | 7/2017 | Song ........................ C11D 7/08 |
| 2020/0148979 A1 | 5/2020 | White |
| 2021/0324525 A1 | 10/2021 | Das |

FOREIGN PATENT DOCUMENTS

| | | |
|---|---|---|
| JP | 2008285508 A | 11/2008 |
| KR | 20050069856 A | 7/2005 |
| WO | 2017156304 A1 | 9/2017 |

* cited by examiner

*Primary Examiner* — Natasha N Campbell

(57) ABSTRACT

The present disclosure relates to removal compositions for at least partially removing post-chemical mechanical polishing (post-CMP) residues from the surface of a microelectronic device. The removal compositions comprise an aqueous base composition and various molybdenum etching inhibitors that reduce the amount of molybdenum removed from the surface of the microelectronic device compared to the aqueous base composition.

6 Claims, No Drawings

CLEANING COMPOSITION WITH MOLYBDENUM ETCHING INHIBITOR

TECHNICAL FIELD

The present disclosure relates to removal compositions for at least partially removing post-chemical mechanical polishing (post-CMP) residues from the surface of a microelectronic device. The removal compositions comprise an aqueous base composition and various molybdenum etching inhibitors that reduce the amount of molybdenum removed from the surface of the microelectronic device compared to the aqueous base composition.

BACKGROUND

Microelectronic device wafers are used to form integrated circuits and include a substrate, such as silicon, on which regions are patterned for deposition of different materials having insulative, conductive or semi-conductive properties. To obtain the correct patterning, excess material used in forming the layers on the substrate must be removed. Further, to fabricate functional and reliable circuitry, it is important to prepare a flat or planar microelectronic wafer surface prior to subsequent processing. Thus, it is necessary to remove and/or polish certain surfaces of a microelectronic device wafer.

Chemical Mechanical Polishing or Planarization ("CMP") is a process in which material is physically and chemically removed from a surface of a microelectronic device wafer. The surface is polished (more specifically, planarized) by coupling a physical process such as abrasion with a chemical process such as oxidation or chelation. In its most rudimentary form, CMP involves applying slurry, e.g., a dispersion of an abrasive and an active chemistry, to a polishing pad that buffs the surface of a microelectronic device wafer to achieve the removal, planarization, and polishing processes. It is not desirable for the removal or polishing process to be comprised of purely physical or purely chemical action, but rather it is the synergistic combination of both that achieves fast uniform removal.

Following CMP processing, particles, residue and other contaminants may be present on the surface of the microelectronic device. Towards that end, post-CMP removal compositions have been developed to remove the post-CMP residue, particles, and contaminants, which may interfere with subsequent device processing steps. However, often these post-CMP removal compositions unintentionally at least partially remove other materials from the device surface that should remain.

For example, as semiconductor devices become more highly integrated and minute, molybdenum films are receiving greater attention as a potential new metal electrode for next generation semiconductor devices. However, during typical post-CMP removal process, removal compositions often remove unacceptable levels of molybdenum from the surface as well, which can lead to the development of faults and pattern defects. This becomes a greater problem the higher the pH of the removal composition.

In relation to this, new additives are needed to inhibit Mo corrosion (lower etch rate and lower roughness) while post CMP cleaning of dielectric substrates (PETEOS, $SiO_2$, thermal oxide, silicon nitride, silicon, etc.) are well cleaned at the same time.

Therefore, there is a need remains in the art for a high pH aqueous removal composition that can effectively remove post-CMP residues from a surface of a microelectronic device while inhibiting the removal of molybdenum from this device.

BRIEF SUMMARY

In one embodiment, the present disclosure relates to a removal composition for removing post-CMP residue from the surface of a microelectronic device. The removal composition comprises an aqueous base composition having a pH of greater than 10 comprising water and at least one of an organic additive, a cleaning additive, a water-miscible organic solvent, and a pH adjustor. The removal composition further comprises at least one molybdenum etching inhibitor selected from the group consisting of:

a) a quaternary ammonium compound of Formula A:

$$\text{Ar}-\text{R}-\text{N}^+(\text{R}^1)(\text{R}^2)(\text{R}^3)\text{X}^- \qquad (A),$$

wherein Ar is a substituted or unsubstituted aryl group and $X^-$ is an hydroxy ion, a halide ion, a sulfate ion, or a methanesulfonate ion and wherein:

1) R is a methylene or ethylene group; $R^1$, $R^2$, and $R^3$ are straight chain or branched alkyl groups, and at least one of $R^1$, $R^2$, and $R^3$ is a $C_4$-$C_{20}$ alkyl group,
2) R is a $C_3$-$C_{20}$ alkylene group and $R^1$, $R^2$, and $R^3$ are a methyl or ethyl group, or
3) R is a $C_1$-$C_{20}$ alkylene group, $R^1$, $R^2$, and $R^3$ are straight chain or branched alkyl groups, and at least one of $R^1$, $R^2$, and $R^3$ comprises a glycol group, b) a quaternary ammonium compound of Formula B:

$$(R^4)(R^5)(R^6)(R^7)N^+X^- \qquad (B),$$

wherein $R^4$, $R^5$, $R^6$, and $R^7$ are straight or branched alkyl groups and at least two of $R^4$, $R^5$, $R^6$, and $R^7$ are a $C_6$-$C_{20}$ alkyl group, c) a pyridinium compound of Formula C or a bipyridinium compound of Formula D:

$$R^9-(C_5H_5N^+)-R^8X^- \qquad (C),$$

$$R^8-(^+NC_5H_5)-(C_5H_5N^+)-R^8X^- \qquad (D)$$

wherein $R^8$ is an alkyl group and $R^9$ is a substituted or unsubstituted, straight chain or branched alkyl or alkylene group, and d) a radical scavenger selected from the group consisting of an hydroxybenzene, a pyrazolinone, a compound having an aminoxyl radical, a gluconolactone, a tertiary alkyl alcohol, and ascorbic acid.

The removal composition removes less molybdenum from a surface of a microelectronic device comprising molybdenum than the aqueous base composition.

In another embodiment, the present disclosure relates to a method of removing post-CMP residues from a surface of a microelectronic device comprising a molybdenum material. The method comprises contacting the surface of the microelectronic device with a removal composition and at least partially removing the post-CMP residue from the surface of the microelectronic device. The removal composition comprises an aqueous base composition having a pH of greater than 10 comprising water and at least one of an organic additive, a cleaning additive, a water-miscible organic solvent, and a pH adjustor. The removal composition further comprises at least one molybdenum etching inhibitor selected from the group consisting of:

a) a quaternary ammonium compound of Formula A:

$$\text{Ar}-\text{R}-\text{N}^+(\text{R}^1)(\text{R}^2)(\text{R}^3)\text{X}^- \qquad (A),$$

wherein Ar is a substituted or unsubstituted aryl group and X⁻ is an hydroxy ion, a halide ion, a sulfate ion, or a methanesulfonate ion and wherein:
1) R is a methylene or ethylene group; $R^1$, $R^2$, and $R^3$ are straight chain or branched alkyl groups, and at least one of $R^1$, $R^2$, and $R^3$ is a $C_4$-$C_{20}$ alkyl group,
2) R is a $C_3$-$C_{20}$ alkylene group and $R^1$, $R^2$, and $R^3$ are a methyl or ethyl group, or
3) R is a $C_1$-$C_{20}$ alkylene group, $R^1$, $R^2$, and $R^3$ are straight chain or branched alkyl groups, and at least one of $R^1$, $R^2$, and $R^3$ comprises a glycol group,
b) a quaternary ammonium compound of Formula B:

$(R^4)(R^5)(R^6)(R^7)N^+X^-$ (B), wherein $R^4$, $R^5$, $R^6$, and $R^7$ are straight or branched alkyl groups and at least two of $R^4$, $R^5$, $R^6$, and $R^7$ are a $C_6$-$C_{20}$ alkyl group,
c) a pyridinium compound of Formula C or a bipyridinium compound of Formula D:

$R^9—(C_5H_5N^+)—R^8X^-$ (C),

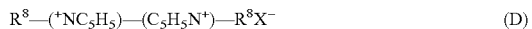
$R^8—(^+NC_5H_5)—(C_5H_5N^+)—R^8X^-$ (D)

wherein $R^8$ is an alkyl group and $R^9$ is a substituted or unsubstituted, straight chain or branched alkyl or alkylene group, and
d) a radical scavenger selected from the group consisting of an hydroxybenzene, a pyrazolinone, a compound having an aminoxyl radical, a gluconolactone, a tertiary alkyl alcohol, and ascorbic acid.

The removal composition removes less of the molybdenum material from the surface of the microelectronic device than the aqueous base composition.

The present disclosure further relates to a method of inhibiting the etching of a molybdenum material from a surface of a microelectronic device. The method comprises: i) providing an aqueous base composition having a pH of greater than 10 comprising water and at least one of an organic additive, a cleaning additive, a water-miscible organic solvent, and a pH adjustor, ii) combining the aqueous base composition and at least one molybdenum etching inhibitor to form a removal composition, the molybdenum etching inhibitor selected from the group consisting of:
a) a quaternary ammonium compound of Formula A:

$Ar—R—N^+(R^1)(R^2)(R^3)X^-$ (A), wherein Ar is a substituted or unsubstituted aryl group and X⁻ is an hydroxy ion, a halide ion, a sulfate ion, or a methanesulfonate ion and wherein:
1) R is a methylene or ethylene group; $R^1$, $R^2$, and $R^3$ are straight chain or branched alkyl groups, and at least one of $R^1$, $R^2$, and $R^3$ is a $C_4$-$C_{20}$ alkyl group,
2) R is a $C_3$-$C_{20}$ alkylene group and $R^1$, $R^2$, and $R^3$ are a methyl or ethyl group, or
3) R is a $C_1$-$C_{20}$ alkylene group, $R^1$, $R^2$, and $R^3$ are straight chain or branched alkyl groups, and at least one of $R^1$, $R^2$, and $R^3$ comprises a glycol group,
b) a quaternary ammonium compound of Formula B:

$(R^4)(R^5)(R^6)(R^7)N^+X^-$ (B), wherein $R^4$, $R^5$, $R^6$, and $R^7$ are straight or branched alkyl groups and at least two of $R^4$, $R^5$, $R^6$, and $R^7$ are a $C_6$-$C_{20}$ alkyl group,
c) a pyridinium compound of Formula C or a bipyridinium compound of Formula D:

$R^9—(C_5H_5N^+)—R^8X^-$ (C),

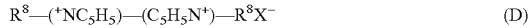
$R^8—(^+NC_5H_5)—(C_5H_5N^+)—R^8X^-$ (D)

wherein $R^8$ is an alkyl group and $R^9$ is a substituted or unsubstituted, straight chain or branched alkyl or alkylene group, and
d) a radical scavenger selected from the group consisting of an hydroxybenzene, a pyrazolinone, a compound having an aminoxyl radical, a gluconolactone, a tertiary alkyl alcohol, and ascorbic acid, and
iii) contacting the surface of a microelectronic device comprising a molybdenum material with the removal composition. The removal composition removes less molybdenum from the surface of the microelectronic device than the aqueous base composition.

DETAILED DESCRIPTION

The present disclosure relates generally to aqueous removal compositions for removing post-CMP residues from the surface of a microelectronic device. The removal compositions have a high pH and include various specific molybdenum etching inhibitors which have surprisingly been found to decrease the amount of molybdenum etching from the device surface compared to the same composition without the molybdenum etching composition, even at a pH of 10 or more.

The term "post-CMP residue" as used herein corresponds to contaminants arising from the use of a CMP slurry, such as particles including abrasives and chemicals present in the slurry, reaction by-products of the polishing slurry, polishing pad particles, brush deloading particles, equipment materials of construction particles, metal, organic residues, and any other materials that are the by-products of the CMP process. In addition, if various metal layers are removed during the CMP process, the post-CMP residue can further comprise metal-containing particles.

For the presently disclosed compositions, where specific components of the compositions are discussed in reference to weight percentage ranges including a zero lower limit, it will be understood that such components may be present or absent in various specific embodiments of the composition, and that, in instances where such components are present, they may be present at concentrations as low as 0.001 weight percent, based on the total weight of the composition in which such components are employed.

When used herein, the term "substantially devoid" is defined as less than 2 wt. %, preferably less than 1 wt. %, more preferably less than 0.5 wt. %, and most preferably less than 0.1 wt. %. "Devoid" is intended to correspond to less than 0.001 wt. % to account for environmental contamination. As such, "devoid" may refer to "free of" a particular component. Furthermore, as used herein, "about" is intended to correspond to ±5% of the stated value, such as 2% or 1% of the value.

As used herein, the term "microelectronic device" is not meant to be limiting in any way and includes any substrate that will eventually become a microelectronic device or microelectronic assembly. For example, a "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. A particularly preferred example of a microelectronic device is a 3D-NAND device. Device substrates from which post-CMP residue may be removed by the presently described composition can be any known in the art, including, for example, substrates comprising PETEOS, $SiO_2$, thermal oxide, silicon nitride, silicon, etc.

Device substrates may be polished with a CMP slurry that contains abrasive particles such as silica and ceria, organic reagents, solvents, and other known components. It is becoming more and more difficult to clean the polished substrates to the required extent due to the strong interactions between the abrasive particles and the device surfaces, particularly via H-bonding and van der Waals forces at a low or moderate pHs, and due to particle agglomeration and reprecipitation at high pHs. Unremoved residues often lead to device defectivity.

Thus, the present disclosure relates to removal compositions and methods for removing post-CMP residue from the surface of a microelectronic device. The removal compositions comprise an aqueous base composition having a pH of greater than 10 that comprises water and at least one of: an organic additive, a cleaning additive, a water-miscible organic solvent, and a pH adjustor. The removal composition further comprises at least one type of specified molybdenum etching inhibitor.

Thus, the removal compositions described herein are high pH aqueous removal compositions, having a pH greater than 10. Preferably, the pH of the removal composition is from about 10 to about 14, such as from about 12 to about 14 including a pH of from 13-14. While an aqueous composition having this high pH would generally be expected to remove many types of post-CMP residues, it would have also been expected to remove various conductive metal layers, such as molybdenum layers. Inhibition of molybdenum etching at high pH is known to be very difficult to achieve, while also providing adequate post-CMP residue removal.

However, after extensive experimental investigation, the present inventors have identified various classes of molybdenum etching inhibitors, which, in combination with other additional components, have surprisingly been found to result in a high pH aqueous removal composition with reduced etching of molybdenum but with a high post-CMP removal rate. The removal composition, as noted above, comprises an aqueous (i.e., comprising greater than 50% water) base composition having a pH of greater than 10. The aqueous base composition further comprises at least one of an organic additive, at least one cleaning additive, at least one water-miscible organic solvent, and at least one pH adjustor. For example, the aqueous base composition may comprise one, two three, or all four of these addition components. Preferably the aqueous base composition comprises each of these components. In addition to the aqueous base composition, the removal composition further comprises at least one specified type of molybdenum etching inhibitor. It has surprisingly been found that, by inclusion of these particular classes of etching inhibitors, the high pH removal compositions have reduced molybdenum etching compared to the aqueous base composition, which is the same composition but without these inhibitors.

Thus, the removal composition of the present disclosure comprises an aqueous base composition having a pH of greater than 10. Preferably, the pH of the aqueous base composition is from about 10 to about 14, such as from about 12 to about 14 including a pH of from 13-14. The pH of the composition can be adjusted to achieve the desired pH by adding a desired amount of a pH adjustor. The base composition is an aqueous composition, comprising greater than 50 wt % water, including greater than 60 wt % or greater than 70 wt % water.

In one embodiment, the aqueous removal composition comprises at least one pH adjustor. Examples of suitable pH adjustors include, but are not limited to, bases such as alkali metal hydroxides, alkaline earth metal hydroxides, tetraalkyl ammonium hydroxides (such as tetramethylammonium hydroxide (TMAH), tetraethylammonium hydroxide (TEAH), tetrapropylammonium hydroxide (TPAH), and tetrabutylammonium hydroxide (TBAH)), tributylmethylammonium hydroxide (TBMAH) benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, tetraalkyl phosphonium hydroxides (such as tetrabutylphosphonium hydroxide (TBPH), tetramethylphosphonium hydroxide, tetraethylphosphonium hydroxide, and tetrapropylphosphonium hydroxide), benzyltriphenylphosphonium hydroxide, methyl triphenylphosphonium hydroxide, ethyl triphenylphosphonium hydroxide, N-propyl triphenylphosphonium hydroxide, and combinations thereof. Preferably the pH adjustor comprises choline hydroxide.

The aqueous base composition described herein can be and preferably is substantially devoid of ammonia or ammonium hydroxide. More preferably, the aqueous base composition is ammonia and ammonium hydroxide free. These bases, while effective at raising the pH to the desired level, present substantial health and environmental concerns and would significantly increase costs for handling and mitigation of these issues.

The pH adjustor may be present in any amount effective to provide and/or maintain a pH that is greater than 10. In particular, the aqueous base composition may comprise from about 0.1 wt % to about 40 wt % of the pH adjustor. Preferably, the amount of pH adjustor is from about 1.0 wt % to about 30 wt %, and, more preferably, from about 3 wt % to about 20 wt %, including from about 5 wt % to about 10 wt %.

The aqueous base composition may further comprise at least one organic additive. An organic additive, as used herein, can be any compound capable of forming a complexed structure with individual atoms/molecules/materials. Suitable organic additives include, but are not limited to, complexing agents such as aminoethylethanolamine, N-methylaminoethanol, aminoethoxyethanol, dimethylaminoethoxyethanol, diethanolamine, N-methyldiethanolamine, monoethanolamine (MEA), triethanolamine (TEA), 1-amino-2-propanol, 2-amino-1-butanol, isobutanolamine, triethylenediamine, 4-(2-hydroxyethyl)morpholine (HEM), ethylenediamine tetraacetic acid (EDTA), m-xylenediamine (MXDA), iminodiacetic acid (IDA), 2-(hydroxyethyl)iminodiacetic acid (HIDA), nitrilotriacetic acid, thiourea, 1,1,3,3-tetramethylurea, urea, urea derivatives, uric acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, 1-hydroxyethylidene-1,1-diphosphonic acid (HEDP), 1,5,9-triazacyclododecane-N,N',N''-tris(methylenephosphonic acid) (DOTRP), 1,4,7,10-tetraazacyclododecane-N,N',N'',N'''-tetrakis(methylenephosphonic acid) (DOTP), nitrilotris(methylene)triphosphonic acid, diethylenetriaminepentakis(methylene phosphonic acid) (DETAP), aminotri(methylene phosphonic acid), bis(hexamethylene)triamine pentamethylene phosphonic acid, 1,4,7-triazacyclononane-N,N',N''-tris(methylenephosphonic acid (NOTP), hydroxyethyldiphosphonate, nitrilotris(methylene)phosphonic acid, 2-phosphono-butane-1,2,3,4-tetracarboxylic, carboxyethyl phosphonic acid, aminoethyl phosphonic acid, glyphosate, ethylene diamine tetra (methylenephosphonic acid) phenylphosphonic acid, oxalic acid, succinnic acid, maleic acid, malic acid, malonic acid, adipic acid, phthalic acid, lactic acid, citric acid, sodium citrate, potassium citrate, ammonium citrate, tricarballylic acid, trimethylolpropionic acid, tartaric acid, glucuronic acid, 2-carboxypyridine, 4,5-dihydroxy-1,3-benzenedisulfonic acid disodium salt, and combinations thereof. Preferably, the organic additive is selected from the group consisting of 1-amino-2-propanol and monoethanolamine.

The organic additive may be present in any amount effective to improve the rate of removal of the post-CMP residue. For example, when used, the aqueous base composition may comprise from about 0.1 wt % to about 20 wt % of the organic additive. Preferably, the amount of organic additive is from about 0.2 wt % to about 15 wt %, and, more preferably, from about 0.3 wt % to about 10 wt %, including from about 0.5 wt % to about 5 wt %.

The aqueous base composition may further comprise at least one cleaning additive, which aids in the removal of the post-CMP residue from the surface of a microelectronic device. Suitable examples of cleaning additives include, for example, ethylene glycol monobutyl ether, diethylene glycol monobutyl ether, propylene glycol monobutyl ether, dipropylene glycol monobutyl ether, ethylene glycol monohexyl ether, diethylene glycol monohexyl ether, triethylene glycol monobutyl ether, ethylene glycol monophenyl ether, diethylene glycol monophenyl ether, propylene glycol monophenyl ether, dimethylsulfoxide, sulfolane, poly(styrene sulfonic acid) or salts thereof, poly(vinyl pyrrolidone), poly(vinylpyrrolidone)/vinyl acetate, poly(vinyl acetate), poly(vinyl alcohol), homopolymers such as phosphonated polyethyleneglycol oligomers, poly(acrylamide), poly(acrylic acid) (PAA) and salts thereof such as poly(acrylic acid) ammonium salt, poly(methacrylic acid) and salts thereof such as poly(methacrylic acid) ammonium salt, acrylic acid and methacrylic acid homopolymer and copolymers with, for example, acrylamidomethylpropane sulfonic acid and maleic acid, and salts thereof; poly(2-acrylamido-2-methyl-1-propanesulfonic acid) and copolymers thereof, polydiallyldimethylammonium chloride, poly(dimethylaminoethylmethacrylate) and copolymers thereof, poly(trimethylaminoethylmethacryate) salts and copolymers thereof poly(hydroxyethyl)acrylate (and copolymers thereof), poly(hydroxyethyl)methacrylate (and copolymers thereof), maleic acid/vinyl ether copolymer, poly(ethylene glycol) (PEG), polypropylene glycol) (PPG), polyethylene glycol-co-polypropylene glycol, PPG-PEG-PPG block copolymers, PEG-PPG-PEG block copolymers, poly(styrene sulfonic acid), poly(vinyl sulfonic acid), poly(vinyl phosphonic acid), poly(vinyl phosphoric acid), poly(ethyleneimine), poly(propyleneimine), polyallylamine, polyethylene oxide (PEO), hydroxyethyl cellulose, methylhydroxyethyl cellulose, hydroxypropyl cellulose, methylhydroxypropyl cellulose, xanthan gum, potassium alginate, pectin, carboxymethylcellulose, glucosamine, poly(diallyldimethylammonium) chloride, PEGylated (i.e., polyethyleneglycol-ated) methacrylate/acrylate copolymers, poly(2-methacryloxyethyltrimethylammonium chloride) and copolymers thereof, ethoxylated alcohols or phenols, ethoxylated fatty acid sugars, dodecylbenzene sulfonic acid, lauryl sulfonic acid, octanoic acid, nonanoic acid, decanoic acid, undecylic acid, dodecanoic acid, benzyldimethyldodecylammonium chloride, benzyldimethyldodecylammonium hydroxide, and trimethyldodecylammonium chloride, and combinations thereof. The copolymers above may be random or block copolymers. Preferably, the cleaning additive is selected from the group consisting of nonanoic acid, ethoxylated alcohols, poly(acrylic acid), diethylene glycol monobutyl ether, ethyleneglycol monohexyl ether, and dodecylbenzenesulfonic acid (DDBSA).

When present, the amount of cleaning additive in the aqueous base composition is in a range of from about 0.001 wt % to about 20 wt %, based on the total weight of the aqueous base composition. For example, the cleaning additive may be present in an amount of from about 0.1 wt % to about 10 wt %, based on the total weight of the composition, including in an amount of from about 0.5 wt % to about 5 wt %.

The aqueous base composition may further comprise at least one water-miscible organic solvent. Suitable examples of water-miscible solvents include, for example, glycols, glycol ethers, methanol, ethanol, isopropanol, butanol and higher alcohols chosen from $C_2$-$C_4$ diols and $C_2$-$C_4$ triols, tetrahydrofurfuryl alcohol, such as 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butanol, 2-chloroethanol), dichloromethane, chloroform, acetic acid, propionic acid, trifluoroacetic acid, tetrahydrofuran N-methylpyrrolidinone, cyclohexylpyrrolidinone, N-octylpyrrolidinone, N-phenylpyrrolidinone, methyldiethanolamine, methyl formate, dimethyl formamide, dimethylsulfoxide, tetramethylene sulfone, diethyl ether, phenoxy-2-propanol, propriophenone, ethyl lactate, ethyl acetate, ethyl benzoate, acetonitrile, acetone, ethylene glycol, propylene glycol, 1,3-propanediol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether, tripropylene glycol methyl ether, dipropylene glycol dimethyl ether, dipropylene glycol ethyl ether, propylene glycol n-propyl ether, dipropylene glycol n-propyl ether, tripropylene glycol n-propyl ether, propylene glycol n-butyl ether, dipropylene glycol n-butyl ether, tripropylene glycol n-butyl ether, propylene glycol phenyl ether, ethylene glycol monophenyl ether, diethylene glycol monophenyl ether hexaethylene glycol monophenylether, dipropylene glycol methyl ether acetate, tetraethylene glycol dimethyl ether, dibasic ester, glycerine carbonate, N-formyl morpholine, triethyl phosphate, glycerol, sorbitol, glycol ethers, urea, dicyandiamide, and combinations thereof. Preferably, the water-miscible solvent is selected from the group consisting of glycerol and sorbitol.

When present, the amount of water-miscible solvent in the aqueous base composition is in a range of from about 0.1 wt % to about 20 wt %, based on the total weight of the aqueous base composition. For example, the cleaning additive may be present in an amount of from about 0.2 wt % to about 15 wt %, based on the total weight of the composition, including in an amount of from about 0.5 wt % to about 10 wt %, from about 1.0 wt % to about 10 wt %, or from about 5.0 wt % to about 10 wt %.

Thus, the aqueous base composition comprises water and at least one of an organic additive, a cleaning additive, a water-miscible organic solvent, and a pH adjuster, and has a pH of greater than 10. This composition can be used as a base to form a removal composition for removing post-CMP residue from the surface of a microelectronic device by inclusion of at least one molybdenum etching inhibitor. The etching inhibitor and the aqueous base composition may be combined in any manner known in the art, resulting in formation of the removal composition. For example, the inhibitor may be combined with a preformed aqueous base composition or may be included as the aqueous base composition is being formed.

More specifically, the removal composition comprises the aqueous base composition and at least one molybdenum etching inhibitor. The inhibitor is selected from the group consisting of a quaternary ammonium compound having the formula Ar—R—N$^+$(R$^1$)(R$^2$)(R$^3$) X$^-$ (herein referred to as Formula A), a quaternary ammonium compound having the formula (R$^4$)(R$^5$)(R$^6$)(R$^7$)N$^+$ X$^-$ (herein referred to a Formula B), a pyridinium compound having the formula R$^9$—(C$_5$H$_5$N$^+$)—R$^8$X$^-$ (herein referred to a Formula C), a bipyridinium compound having the formula R$^8$—($^+$NC$_5$H$_5$)—(C$_5$H$_5$N$^+$)—R$^8$X$^-$ (herein referred to as Formula D), and a radical scavenger selected from the group consisting of an hydroxybenzene, a pyrazolinone, a compound having an aminoxyl radical, a gluconolactone, a tertiary alkyl alcohol, and ascorbic acid. By including at least one of these selected types of etching inhibitors, the removal compositions were surprisingly found to remove less molybdenum from a surface of a microelectronic device comprising molybdenum than the aqueous base composition, without significant impact on its ability to remove post-CMP residues from the device surface.

Thus, the removal composition comprises a quaternary ammonium compound of Formula A:

Ar—R—N$^+$(R$^1$)(R$^2$)(R$^3$)X$^-$     (A),

In this formula, Ar is a substituted or unsubstituted aryl group, such as a phenyl group, and X$^-$ is a counterion such as an hydroxy ion, a halide ion, a sulfate ion, or a methanesulfonate ion. As a specific embodiment of the quaternary ammonium compound of Formula A, R is a methylene or ethylene group; R$^1$, R$^2$, and R$^3$ are straight chain or branched alkyl groups, and at least one of R$^1$, R$^2$, and R$^3$ is a C$_4$-C$_{20}$ alkyl group. For example, R$^1$, R$^2$, and R$^3$ may be a C$_{10}$-C$_{20}$ alkyl group. As another specific embodiment of the quaternary ammonium compound of Formula A, R is a C$_3$-C$_{20}$ alkylene group and R$^1$, R$^2$, and R$^3$ are a methyl or ethyl group. For example, R may be a C$_4$-C$_{10}$ alkylene group. As yet another specific embodiment, R is a C$_1$-C$_{20}$ alkylene group; R$^1$, R$^2$, and R$^3$ are straight chain or branched alkyl groups; and at least one of R$^1$, R$^2$, and R$^3$ comprises a glycol group. For example, the glycol group may be an ethyleneglycol group. Suitable specific examples of quaternary ammonium compounds of Formula A include a benzyldodecyldimethyl ammonium salt, a benzyltetradecyldimethyl ammonium salt, a phenylpropyltriethyl ammonium salt, or a benzethonium salt.

Furthermore, or in the alternative, the removal composition comprises a quaternary ammonium compound of Formula B:

(R$^4$)(R$^5$)(R$^6$)(R$^7$)N$^+$X$^-$     (B),

In this formula, R$^4$, R$^5$, R$^6$, and R$^7$ are straight or branched alkyl groups and at least two of R$^4$, R$^5$, R$^6$, and R$^7$ are a C$_6$-C$_{20}$ alkyl group. In a specific embodiment, at least three of R$^4$, R$^5$, R$^6$, and R$^7$ are a C$_6$-C$_{20}$ alkyl group. Suitable specific examples of quaternary ammonium compounds of Formula B include a tetrapropyl ammonium salt, a tetrabutyl ammonium salt, or a methyltrioctyl ammonium salt.

Furthermore, or in the alternative, the removal composition comprising a pyridinium compound of Formula C:

R$^9$—(C$_5$H$_5$N$^+$)—R$^8$X$^-$     (C), or a bipyridinium compound of Formula D:

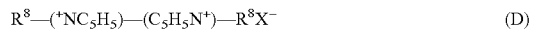

R$^8$—($^+$NC$_5$H$_5$)—(C$_5$H$_5$N$^+$)—R$^8$X$^-$     (D)

In these formulas, R$^8$ is an alkyl group and R$^9$ is a substituted or unsubstituted, straight chain or branched alkyl or alkylene group. A suitable specific example of a pyridinium compound of Formula C includes N-ethyl-4-(3-phenylpropyl) pyridine, and a suitable specific example of a bipyridinium compound of Formula D includes an ethyl viologen dihalide salt.

Furthermore, or in the alternative, the removal composition comprises a radical scavenger selected from the group consisting of an hydroxybenzene, a pyrazolinone, a compound having an aminoxyl radical, a gluconolactone, a tertiary alkyl alcohol, and ascorbic acid. Suitable specific examples of radical scavengers include 2,5-dihydroxybenzoic acid, 2,3-dihydroxybenzoic acid, 3,4-dihydroxybenzoic acid, 4-hydroxy-TEMPO, 4-phosphonoxy-TEMPO, 3-methyl-1-phenyl-2-pyrazolin-5-one, trans-4-hydroxycinnamic acid, guaiacol, t-butyl alcohol, or glucono-1,5-lactone.

When present, the amount of the molybdenum etching inhibitor in the removal composition is in a range of from about 0.05 wt % to about 10 wt %, based on the total weight of the removal composition. For example, the molybdenum etching inhibitor additive may be present in an amount of from about 0.1 wt % to about 8.0 wt %, based on the total weight of the composition, including in an amount of from about 0.2 wt % to about 5.0 wt %.

EXAMPLES

Aqueous removal compositions of the present disclosure were prepared by combining various aqueous base compositions and specific molybdenum etching inhibitors as shown in Table 1 below. Comparative Example removal compositions were similarly prepared and are also included in this table. Specific information regarding the aqueous base compositions are shown in Tables 2A-2C, and the inhibitors used are shown in Table 3. Molybdenum etch rates were determined by exposing a coupon having a molybdenum layer to the specified composition at a temperature of 30° C.

As the results show, significant inhibition of molybdenum etching was found for compositions comprising the inhibitors described in the present disclosure without a significant reduction is post-CMP residue removal. Compounds having similar structures but not satisfying the specific requirements outlined herein (i.e., comparative compounds) did not achieve inhibition of molybdenum etching.

TABLE 1

| Ex # | Aq Base Comp | Mo Inhibitor | Conc (wt %) of Inhibitor | Amt (mole) of Inhibitor | Mo E/R [A/min] |
|---|---|---|---|---|---|
| AB-1 Control | AB-1 | none | 0 | 0 | 0.68 |
| 1 | AB-1 | A-1 | 0.97 | 0.0028 | 0.51 |
| 2 | AB-1 | A-2 | 1.04 | 0.0028 | 0.66 |
| 3 | AB-1 | A-3 | 0.62 | 0.0028 | 0.57 |
| 4 | AB-1 | D-1 | 1.06 | 0.0028 | 0.54 |
| Comp-1 | AB-1 | CompA-3 | 0.62 | 0.0028 | 0.71 |
| Comp-2 | AB-1 | CompA-4 | 0.84 | 0.0028 | 0.80 |
| Comp-3 | AB-1 | CompD-1 | 1.16 | 0.0028 | 2.68 |
| AB-2 Control | AB-2 | none | 0 | 0 | 1.45 |
| 5 | AB-2 | B-1 | 0.58 | 0.0028 | 1.18 |
| 6 | AB-2 | B-2 | 0.74 | 0.0028 | 1.40 |

TABLE 1-continued

| Ex # | Aq Base Comp | Mo Inhibitor | Conc (wt %) of Inhibitor | Amt (mole) of Inhibitor | Mo E/R [A/min] |
|---|---|---|---|---|---|
| 7 | AB-2 | B-3 | 1.15 | 0.0028 | 0.91 |
| 8 | AB-2 | A-4 | 1.27 | 0.0028 | 1.30 |
| AB-3 Control | AB-3 | none | 0 | 0 | 1.30 |
| 9a | AB-3 | RS-1 | 3.52 | 0.02 | 1.12 |
| 9b | AB-3 | RS-1 | 7.04 | 0.04 | 1.12 |
| 10a | AB-3 | RS-5 | 6.56 | 0.04 | 1.17 |
| 10b | AB-3 | RS-5 | 9.84 | 0.06 | 1.07 |
| 11a | AB-3 | RS-7 | 3.56 | 0.02 | 1.25 |
| 11b | AB-3 | RS-7 | 7.12 | 0.04 | 1.17 |
| 11c | AB-3 | RS-7 | 10.68 | 0.06 | 1.15 |
| 12a | AB-3 | RS-9 | 3.08 | 0.02 | 1.25 |
| 12b | AB-3 | RS-9 | 9.24 | 0.06 | 1.25 |
| 13a | AB-3 | RS-10 | 3.08 | 0.02 | 1.04 |
| 13b | AB-3 | RS-10 | 9.24 | 0.06 | 1.15 |

TABLE 2A

Aqueous Base Composition 1 (AB-1) - pH = 13.4

| Component | CAS# | Wt % |
|---|---|---|
| Water | | 82.94 |
| 1-Amino-2-propanol | 78-96-6 | 4.0 |
| Ethyleneglycol Monohexyl Ether | 112-25-4 | 0.50 |
| 4-Dodecylbenzensulfonic acid (DDBSA) | 121-65-3 | 0.01 |
| Glycerol | 56-81-5 | 6.0 |
| Choline hydroxide | 123-41-1 | 6.55 |

TABLE 2B

Aqueous Base Composition 2 - pH = 13.4

| Component | CAS# | Wt % |
|---|---|---|
| Water | | 73.32 |
| Monoethanolamine (MEA) | 141-43-5 | 4.5 |
| Nonanoic acid | 112-05-0 | 4.38 |
| Diethylene glycol monobutyl ether (BDG) | 112-34-5 | 6.0 |
| D-sorbitol | 50-70-4 | 6.0 |
| Choline hydroxide | 123-41-1 | 5.8 |

TABLE 2C

Aqueous Base Composition 3 - pH = 13.49

| Component | CAS# | Wt % |
|---|---|---|
| Water | | 81.40 |
| Monoethanolamine (MEA) | 141-43-5 | 0.95 |
| Poly(acrylic acid) | 9003-07-4 | 0.50 |
| Brij L23 | 9002-92-0 | 0.20 |
| D-sorbitol | 50-70-4 | 9.0 |
| Choline hydroxide | 123-41-1 | 7.96 |

TABLE 3

| Inhibitor ID | Name | CAS# | Structure |
|---|---|---|---|
| A-1 | Benzyldodecyldimethylammonium Chloride Dihydrate | 139-07-1 | [structure] |
| A-2 | Benzyldimethyltetradecylammonium Chloride | 139-08-2 | [structure] |
| A-3 | 3-phenylpropylamine N-ethylation | | [structure] |
| A-4 | Benzethonium Chloride | 121-54-0 | [structure] |

TABLE 3-continued

| Inhibitor ID | Name | CAS# | Structure |
|---|---|---|---|
| CompA-1 | Benzyltriethylammonium chloride | 56-37-1 | PhCH$_2$-N$^+$(CH$_2$CH$_3$)$_3$ Cl$^-$ |
| CompA-2 | | | Benzyl-N$^+$(Et)$_2$(CH(CH$_3$)$_2$) |
| CompA-3 | 4-propylaniline N-methylation | | 4-(n-propyl)phenyl-N$^+$(Et)$_3$ |
| CompA-4 | 3,3-Diphenylpropylamine N-ethylation | | Ph$_2$CHCH$_2$CH$_2$-N$^+$(Et)$_3$ |
| B-1 | Tetra-n-propylammonium hydroxide | 4499-86-9 | (n-C$_3$H$_7$)$_4$N$^+$ OH$^-$ |
| B-2 | Tetrabutylammonium hydroxide | 2052-49-5 | CH$_3$(CH$_2$)$_3$-N$^+$((CH$_2$)$_3$CH$_3$)$_3$ OH$^-$ |
| B-3 | Methyltri-n-octylammonium Chloride | 5137-55-3 | CH$_3$(CH$_2$)$_7$-N$^+$(CH$_3$)((CH$_2$)$_7$CH$_3$)$_2$ Cl$^-$ |
| CompB-1 | Decyltrimethylammonium Chloride | 10108-87-9 | CH$_3$(CH$_2$)$_9$-N$^+$(CH$_3$)$_3$ Cl$^-$ |
| CompB-2 | Trimethyltetradecylammonium Chloride | 4574-04-3 | CH$_3$(CH$_2$)$_{13}$-N$^+$(CH$_3$)$_3$ Cl$^-$ |
| CompB-3 | Cetyltrimethylammonium chloride solution | 112-02-7 | CH$_3$(CH$_2$)$_{14}$CH$_2$-N$^+$(CH$_3$)$_3$ Cl$^-$ |

TABLE 3-continued

| Inhibitor ID | Name | CAS# | Structure |
|---|---|---|---|
| C-1 | 4-(3-phenylpropyl)pyridine N-ethylation | | (structure) |
| D-1 | Ethyl viologen dibromide | 53721-12-3 | (structure) |
| CompD-1 | Benzyl viologen dichloride | 1102-19-8 | (structure) |
| RS-1 | Ascorbic acid | 50-81-7 | (structure) |
| RS-2 | 2,5-Dihydroxybenzoic acid | 490-79-9 | (structure) |
| RS-3 | 4-Hydroxy-TEMPO, free radical, 98% | 2226-96-2 | (structure) |
| RS-4 | 3-Methyl-1-phenyl-2-pyrazolin-5-one, 98% | 89-25-8 | (structure) |
| RS-5 | trans-4-Hydroxycinnamic acid, 98% | 501-98-4 | (structure) |
| RS-6 | 2-methoxyphenol (Guaiacol), 98% | 90-05-1 | (structure) |

TABLE 3-continued

| Inhibitor ID | Name | CAS# | Structure |
|---|---|---|---|
| RS-7 | D-(+)-Glucono-1,5-lactone, 99% | 90-80-2 | |
| RS-8 | tert-Butyl Alcohol | 75-65-0 | |
| RS-9 | 2,3-Dihydroxybenzoic acid | 303-38-8 | |
| RS-10 | 3,4-Dihydroxybenzoic acid | 99-50-3 | |
| CompRS-1 | 3-Phenylpropionitrile N-ethylation | | |
| CompRS-2 | L-Hystidine | 71-00-1 | |
| CompRS-3 | 1-n-Octyl-2-pyrrolidone | 2687-94-7 | |

What is claimed is:

1. A method of removing post-CMP residues from a surface of a microelectronic device comprising a molybdenum material, the method comprising:
   i) contacting the surface of the microelectronic device with a removal composition comprising an aqueous base composition having a pH of greater than 10 comprising water and at least one of: an organic additive, a cleaning additive, a water-miscible organic solvent, and a pH adjustor,
   wherein the removal composition further comprises at least one molybdenum etching inhibitor selected from the group consisting of:
   (a) a pyridinium compound of Formula C:

wherein $R^8$ is an alkyl group, $R^9$ is a substituted or unsubstituted, straight chain or branched alkyl or alkylene group, and $X^-$ is an hydroxy ion, a halide ion, a sulfate ion, or a methanesulfonate ion, and
   (b) a radical scavenger selected from the group consisting of an hydroxybenzene, a pyrazolinone, a compound having an aminoxyl radical, a gluconolactone, a tertiary alkyl alcohol, and ascorbic acid; and
   ii) at least partially removing the post-CMP residue from the surface of the microelectronic device,
   wherein the removal composition removes less of the molybdenum material from the surface of the microelectronic device than the aqueous base composition.

2. The method of claim 1, wherein the molybdenum etching inhibitor is a pyridinium compound of Formula C.

3. The method of claim 2, wherein the molybdenum etching inhibitor is N-ethyl-4-(3-phenylpropyl)pyridine.

4. The method of claim 1, wherein the molybdenum etching inhibitor is a radical scavenger selected from the group consisting of 2,5-dihydroxybenzoic acid, 2,3-dihydroxybenzoic acid, 3,4-dihydroxybenzoic acid, 4-hydroxy- TEMPO, 3-methyl-1-phenyl-2-pyrazolin-5-one, trans-4-hydroxycinnamic acid, guaiacol, t-butyl alcohol, or glucono-1,5-lactone.

5. The method of claim 1, wherein the removal composition has a pH of from about 10 to about 14.

6. The method of claim 1, wherein the removal composition has a pH of from about 11 to about 13.5.

* * * * *